(12) United States Patent
Khe et al.

(10) Patent No.: US 6,635,585 B1
(45) Date of Patent: Oct. 21, 2003

(54) METHOD FOR FORMING PATTERNED POLYIMIDE LAYER

(75) Inventors: Nguyen Khe, Los Altos, CA (US); Tsing-Chow Wang, Cupertino, CA (US)

(73) Assignee: Aptos Corporation, Milpitas, CA (US)

( * ) Notice: Subject to any disclaimer, the term of this patent is extended or adjusted under 35 U.S.C. 154(b) by 362 days.

(21) Appl. No.: 09/693,571

(22) Filed: Oct. 20, 2000

(51) Int. Cl.[7] ................ H01L 21/31; H01L 21/469
(52) U.S. Cl. ................ 438/780; 438/781; 430/313; 430/317
(58) Field of Search ................ 438/780, 781, 438/782; 430/311, 313, 317

(56) References Cited

U.S. PATENT DOCUMENTS 5,242,864 A   9/1993  Fassberg et al.
5,744,286 A * 4/1998  Choi ..................... 430/326

* cited by examiner

Primary Examiner—Alexander Ghyka
(74) Attorney, Agent, or Firm—Tung & Associates

(57) ABSTRACT

Within a method for forming a patterned polyimide layer, there is first provided a substrate. There is then formed over the substrate a blanket polyamic acid layer. There is then formed upon the blanket polyamic acid layer a patterned photoresist layer. There is then hardened the patterned photoresist layer to form a hardened patterned photoresist layer. There is then patterned, while employing the hardened patterned photoresist layer as an etch mask layer, the blanket polyamic acid layer to form a patterned polyamic acid layer. Finally, there is then thermally annealed the patterned polyamic acid layer to form a patterned polyimide layer. By employing as an etch mask when forming from the blanket polyamic acid layers the patterned polyamic acid layer the hardened patterned photoresist layer, rather than an unhardened patterned photoresist layer, the patterned polyamic acid layer, and consequently also the patterned polyimide layer, are formed with enhanced dimensional control.

14 Claims, 1 Drawing Sheet

METHOD FOR FORMING PATTERNED POLYIMIDE LAYER

BACKGROUND OF THE INVENTION

1. Field of the Invention

The present invention relates generally to methods for forming patterned layers within microelectronic fabrications. More particularly, the present invention relates to methods for forming patterned polyimide layers within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions have decreased, it has become increasingly common in the art of microelectronic fabrication to employ when fabricating microelectronic fabrications microelectronic dielectric layers formed of organic polymer dielectric materials. Microelectronic dielectric layers formed of organic polymer dielectric materials are desirable in the art of microelectronic fabrication when fabricating microelectronic fabrications insofar as microelectronic dielectric layers formed of organic polymer dielectric materials may be readily formed employing spin coating methods to form microelectronic dielectric layers of generally lower dielectric constant and generally higher toughness than microelectronic dielectric layers formed of conventional silicon containing dielectric materials, such as but not limited to silicon oxide dielectric materials, silicon nitride dielectric materials and silicon oxynitride dielectric materials.

Of the organic polymer dielectric materials which may be employed for forming dielectric layers within microelectronic fabrications, polyimide organic polymer dielectric materials are particularly common in the art of microelectronic fabrication. Polyimide organic polymer dielectric materials are in turn desirable in the art of microelectronic fabrication insofar as polyimide organic polymer dielectric materials provide particularly impervious and tough dielectric materials when employed, in particular, for forming passivation dielectric layers when forming microelectronic fabrications.

While polyimide organic polymer dielectric materials are thus particularly desirable in the art of microelectronic fabrication for use when fabricating microelectronic dielectric layers within microelectronic fabrications, polyimide organic polymer dielectric materials are nonetheless not entirely without problems within the art of microelectronic fabrication for use when fabricating microelectronic dielectric layers within microelectronic fabrications. In that regard, it has been observed in the art of microelectronic fabrication that microelectronic dielectric layers formed of polyimide organic polymer dielectric materials are often difficult to readily pattern, with optimal dimensional control, when forming patterned dielectric layers within microelectronic fabrications.

It is thus desirable in the art of microelectronic fabrication to provide methods and materials which may be employed for forming within microelectronic fabrications patterned microelectronic dielectric layers formed of polyimide dielectric materials, with enhanced dimensional control.

It is towards the foregoing object that the present invention is directed.

Various methods and materials have been disclosed in the art of microelectronic fabrication for forming with desirable properties within microelectronic fabrications patterned microelectronic dielectric layers formed of polyimide materials.

For example, Fassberg et al., in U.S. Pat. No. 5,242,864, discloses a method for forming, with enhanced smoothing with respect to a cross-sectional profile, a patterned polyimide layer passivating in part a bond pad layer within a microelectronic fabrication. To realize the foregoing object, the method employs when forming the patterned polyimide layer from a blanket polyamic acid layer formed beneath a patterned photoresist layer which defines an aperture which exposes a portion of the blanket polyamic acid layer over the bond pad layer within the microelectronic fabrication a treatment of the portion of the blanket polyamic acid layer exposed within the aperture to form a polyamic acid salt such that upon thermal annealing of the blanket polyamide layer so treated the polyamic acid salt does not form a polyimide, but the remaining portions of the blanket polyamic acid layer do form a polyimide.

Desirable in the art of microelectronic fabrication are additional methods and materials which may be employed for forming, with enhanced dimensional control, within microelectronic fabrications patterned microelectronic dielectric layers formed of polyimide dielectric materials.

It is towards the foregoing object that the present invention is directed.

SUMMARY OF THE INVENTION

A first object of the present invention is to provide a method for forming a patterned polyimide layer within a microelectronic fabrication.

A second object of the present invention is to provide a method in accord with the first object of the present invention, wherein the patterned polyimide layer is formed with enhanced dimensional control.

A third object of the present invention is to provide a method in accord with the first object of the present invention and the second object of the present invention, wherein the method is readily commercially implemented.

In accord with the objects of the present invention, there is provided by the present invention a method for forming a patterned polyamic acid layer. To practice the method of the present invention, there is first provided a substrate. There is then formed over the substrate a blanket polyamic acid layer. There is then formed upon the blanket polyamic acid layer a patterned photoresist layer. There is then hardened the patterned photoresist layer to form a hardened patterned photoresist layer. There is then patterned, while employing the hardened patterned photoresist layer as an etch mask layer, the blanket polyamic acid layer to form a patterned polyamic acid layer. There may then be thermally annealed the patterned polyamic acid layer to form a patterned polyimide layer.

The present invention provides a method for forming a patterned polyimide layer within a microelectronic fabrication, wherein the patterned polyimide layer is formed with enhanced dimensional control. The present invention realizes the foregoing object by employing within a microelectronic fabrication when forming from a blanket polyamic acid layer from which is formed a patterned polyamic acid layer from which in turn may be formed a patterned polyimide layer a hardened patterned photoresist layer, rather than an unhardened patterned photoresist layer. By employing the hardened patterned photoresist layer rather than an unhardened patterned photoresist layer, the patterned polyamic acid layer, and consequently also the patterned polyimide layer, are formed with enhanced dimensional control.

The method of the present invention is readily commercially implemented. The present invention employs methods and materials as are generally known in the art of microelectronic fabrication, but employed within the context of a specific ordering to provide the present invention. Since it is thus a specific ordering of methods and materials which at least in part provides the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming a patterned polyimide layer within a microelectronic fabrication, wherein the patterned polyimide layer is formed with enhanced dimensional control. The present invention realizes the foregoing object by employing when forming within a microelectronic fabrication from a blanket polyamic acid layer from which is formed a patterned polyamic acid layer from which in turn is formed a patterned polyimide layer, a hardened patterned photoresist layer, rather than an unhardened patterned photoresist layer.

Referring now to FIG. 1 to FIG. 5, there is shown a series of schematic cross-sectional diagrams illustrating the results of progressive stages in forming, in accord with a preferred embodiment of the present invention and with enhanced dimensional control, a pair of patterned polyimide layers within a microelectronic fabrication.

Figure 1:
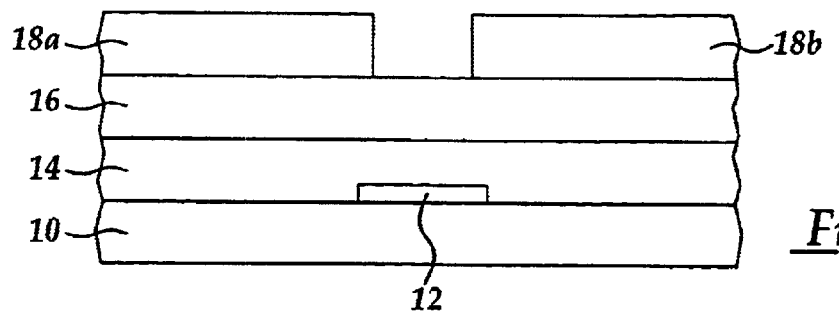
FIG. 1 to FIG. 5 show a series of schematic cross-sectional diagrams illustrating the results of progressive stages in forming, in accord with a preferred embodiment of the present invention, a pair of patterned polyimide layers within a microelectronic fabrication.

Shown in FIG. 1 is a schematic cross-sectional diagram of the microelectronic fabrication at an early stage in its fabrication in accord with the preferred embodiment of the present invention.

Shown in FIG. 1, in a first instance, is a substrate 10, having formed thereupon a bond pad 12.

Within the first preferred embodiment of the present invention with respect to the substrate 10, the substrate 10 may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may consist of a substrate alone as employed within the microelectronic fabrication, or in an alternative, the substrate 10 may comprise a substrate as employed within the microelectronic fabrication, wherein the substrate has formed thereupon and/or thereover any of several additional microelectronic layers as are conventionally employed within the microelectronic fabrication within which is employed the substrate 10. Similarly with the substrate alone as employed within the microelectronic fabrication, such microelectronic layers may be formed of microelectronic materials selected from the group including but not limited to microelectronic conductor materials, microelectronic semiconductor materials and microelectronic dielectric materials.

Similarly, and although also not specifically illustrated within the schematic cross-sectional diagram of FIG. 1, the substrate 10, typically and preferably, but not exclusively, when the substrate 10 consists of or comprises a semiconductor substrate employed within a semiconductor integrated circuit microelectronic fabrication, has formed therein and/or thereupon microelectronic devices as are conventional within the microelectronic fabrication within which is employed the substrate 10. Such microelectronic devices may include, but are not limited to resistors, transistors, diodes and capacitors.

Within the preferred embodiment of the present invention with respect to the bond pad 12, the bond pad 12 may similarly also be formed employing methods and materials as are conventional in the art of microelectronic fabrication, wherein such materials may include, but are not limited to metal, metal alloy, doped polysilicon (having a dopant concentration of greater than about 1E18 atoms per cubic centimeter) and polycide (doped polysilicon/metal silicide stack) conductor materials. Typically and preferably, the bond pad 12 is formed to a thickness of from about 500 to about 12,000 angstroms and a with a bidirectional (areal) linewidth of from about 0.1 to about 120 microns from a metal or metal alloy conductor material, such as but not limited to an aluminum, an aluminum alloy, a copper or a copper alloy conductor material.

Shown also within the schematic cross-sectional diagram of FIG. 1 formed passivating the bond pad 12 and portions of the substrate 10 exposed adjacent the bond pad 12 is a blanket passivation layer 14, and there is similarly also shown within the schematic cross-sectional diagram of FIG. 1 formed upon the blanket passivation layer 14 a blanket polyamic acid layer 16.

Within the preferred embodiment of the present invention with respect to the blanket passivation layer 14, the blanket passivation layer 14 may be formed of passivation materials as are common in the art of microelectronic fabrication, such passivation materials typically and preferably being selected from the group including but not limited to silicon oxide passivation materials, silicon nitride passivation materials, silicon oxynitride passivation materials, laminates thereof and aggregates thereof. Typically and preferably, the blanket passivation layer 14 is formed at least in part of a silicon nitride passivation material formed to a thickness of from about 1 to about 12,000 angstroms passivating the bond pad 12 and portions of the substrate 10 exposed adjacent the bond pad 12.

Within the preferred embodiment of the present invention with respect to the blanket polyamic acid layer 16, while the blanket polyamic acid layer 16 may be formed from any of several polyamic acid materials as are conventional in the art of microelectronic fabrication, the present invention provides particular value under circumstances where the blanket polyamic acid layer 16 is formed of a generally higher molecular weight polyamic acid material, typically and preferably having a molecular weight of from about 100,000 to about 10,000,000 amu, and generally where the polyamic acid material is provided in a solvent solution having a viscosity of from about 500 to about 20,000 centipoise. Within the preferred embodiment of the present invention, the blanket polyamic acid layer 16 is typically and preferably formed to a thickness of from about 0.01 to about 50 microns by spin coating the polyamic acid material in the solvent solution upon the substrate 10 having formed thereover the bond pad 12, followed by a comparatively mild thermal treatment at a temperature not exceeding about 125 degrees centigrade for a time period not exceeding about 2 minutes to remove therefrom at least a portion of the solvent. Under such thermal treatment conditions, the polyamic acid material within the blanket polyamic acid layer 16 typically and preferably undergoes no additional reaction.

As is understood by a person skilled in the art, a polyamic acid material is precursor to a polyimide material, wherein the polyimide material may be formed from the polyamic acid material by thermally annealing to dehydrate the polyamic acid material at generally higher temperatures in a range of from about 300 to about 400 degrees centigrade for generally extended time periods of from about 10 to about 360 minutes.

Finally, there is shown within the schematic cross-sectional diagram of FIG. 1 formed upon the blanket polyamic acid layer 16 a pair of patterned photoresist layers 18a and 18b.

Within the preferred embodiment of the present invention with respect to the pair of patterned photoresist layers 18a and 18b, the pair of patterned photoresist layers 18a and 18b may in general be formed from any of several photoresist materials as are common in the art of microelectronic fabrication, including but not limited to positive photoresist materials and negative photoresist materials. However, the present invention provides particular manufacturing efficiency under conditions where the pair of patterned photoresist layers 18a and 18b is formed of a positive photoresist material which preferably may be photoexposed employing photoexposure radiation in a range of from about 340 to about 400 nanometers and subsequently developed to form the pair of patterned photoresist layers 18a and 18b, and further wherein the pair of patterned photoresist layers 18a and 18b remaining after such photoexposure and development (whether formed of a positive photoresist material, a negative photoresist material or an other photoresist material) is susceptible to an additional hardening which provides enhanced dimensional stability to the pair of patterned photoresist layers 18a and 18b once hardened.

Typically and preferably, the pair of patterned photoresist layers 18a and 18b is formed to a thickness of from about 0.1 to about 100 microns. More preferably, between about 1 and 60 μm, and preferably, between 10 and 30 μm.

Figure 2:
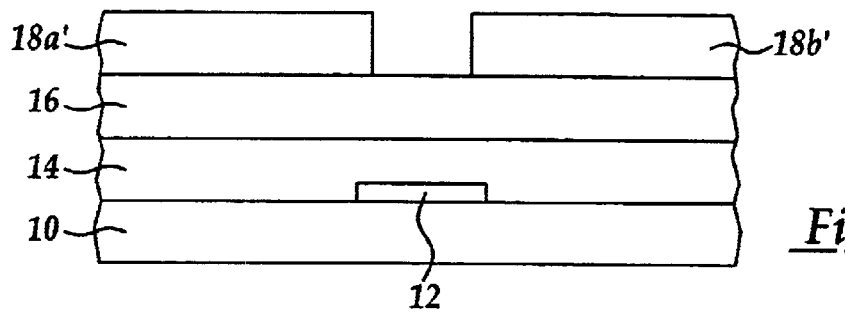

Referring not to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein the pair of patterned photoresist layers 18a and 18b has been hardened to form a pair of hardened patterned photoresist layers 18a' and 18b'.

Within the preferred embodiment of the present invention the pair of patterned photoresist layers 18a and 18b may be hardened to form the pair of hardened patterned photoresist layers 18a' and 18b' while employing any of several hardening methods, including but not limited to thermal annealing hardening methods and radiation exposure hardening methods.

When hardening the pair of patterned photoresist layers 18a and 18b to form the pair of hardened patterned photoresist layers 18a and 18b while employing a thermal annealing hardening method the photoresist material from which is formed the pair of patterned photoresist layers 18a and 18b may be inherently susceptible to hardening upon thermal annealing, such as is exhibited, for example and without limitation by a material composed of photoactive components (such as Diazonaphthoquinone, etc.) embedded in reactive binder including novolac resin, formaldehyde resin, hydroxyl resin, phenolic resin, melamine resin, urea resin or the like, or in the alternative or in the adjunct there may be incorporated into the photoresist material from which is formed the pair of patterned photoresist layers 18a and 18b an infrared absorbing dye which assists with and facilitates a thermal annealing hardening of the pair of patterned photoresist layers 18a and 18b when forming the pair of hardened patterned photoresist layers 18a' and 18b'. Significant to the present invention when forming from the pair of patterned photoresist layers 18a and 18b as illustrated within the schematic cross-sectional diagram of FIG. 1 the pair of hardened patterned photoresist layers 18a' and 18b' as illustrated within the schematic cross-sectional diagram of FIG. 2 while employing a thermal annealing hardening method is that the thermal annealing hardening method does not employ a thermal exposure of a magnitude which causes for appreciable reaction of the blanket polyamic acid layer 16 to form therefrom a blanket polyimide layer. Within the context of the present invention, absence of such "appreciable reaction" of the blanket polyamic acid layer 16 is intended to indicate less than about 30 percent reaction of the blanket polyamic acid layer 16.

When hardening the pair of patterned photoresist layers 18a and 18b to form the pair of hardened patterned photoresist layers 18a' and 18b' while employing a radiation exposure hardening method, the radiation employed within the radiation exposure hardening method may be selected from the group including but not limited to ultraviolet radiation, electron beam radiation, x-radiation and gamma radiation, microwave, provided that the photoresist material from which is formed the pair of patterned photoresist layers 18a and 18b is appropriately intrinsically susceptible to the type of radiation or otherwise extrinsically sensitized to the type of radiation.

Within the preferred embodiment of the present invention, in particular where the pair of patterned photoresist layers 18a and 18b is formed of a positive photoresist material susceptible to photoexposure employing photoexposure radiation of from about 340 to about 400 nanometers, it is preferably that the pair of patterned photoresist layers 18a and 18b formed of the positive photoresist material is susceptible to hardening while employing a photoexposure radiation source of shorter wavelength, and generally less than about 300 nanometers, and preferably between 190 to 28 nanometers.

Figure 3:
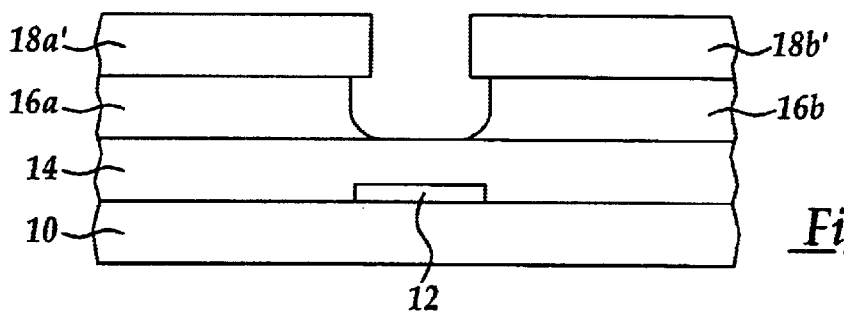

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein the blanket polyamic acid layer 16 has been patterned to form a pair of patterned polyamic acid layers 16a and 16b.

Within the preferred embodiment of the present invention, and although the blanket polyamic acid layer 16 may be patterned to form the pair of patterned polyamic acid layers 16a and 16b while employing etch methods as are conventional in the art of microelectronic fabrication, including but not limited to wet chemical etch methods and dry plasma etch methods, the blanket polyamic acid layer 16 is patterned to form the pair of patterned polyamic acid layers 16a and 16b while employing a wet chemical etch method which employs an appropriate alkaline wet chemical etchant which efficiently etches that polyamic acid material from which is formed the blanket polyamic acid layer 16. Such alkaline wet chemical etchants may be selected from the group including but not limited to hydroxide alkaline wet chemical etchants (such as but not limited to ammonium hydroxide, sodium hydroxide, potassium hydroxide, calcium hydroxide and tetramethyl ammonia hydroxide (TMAH)), and amine alkaline wet chemical etchants (such as but not limited to hydroxylamine, morpholine, quinoline, ethanolamine, aminoalkanols, aminoalkanepolyols, aminoarylols, aminoarylpolyols and derivatives thereof). Typically and preferably the alkaline wet chemical etchant is provided in an aqueous solution at a concentration of from about 0.01 to about 50 weight percent, more preferably from about 0.1 to about 10 weight percent and most preferably from about 1 to about 5 weight percent. Also, the etching temperature can range from about 0° C. to 100° C., preferably from 10° C. to 70° C., and more preferably from 22° C. to 35° C.

As is understood by a person skilled in the art, insofar as the pair of patterned photoresist layers 18a and 18b as illustrated within the schematic cross-sectional diagram of FIG. 1 has been hardened to form the pair of hardened patterned photoresist layers 18a' and 18b' as illustrated within the schematic cross-sectional diagram of FIG. 2, the pair of patterned polyamic acid layers 16a and 16b as illustrated within the schematic cross-sectional diagram of FIG. 3 are formed with enhanced dimensional control insofar as the pair of hardened patterned photoresist layers 18a' and 18b' is formed with enhanced dimensional stability.

Figure 4:
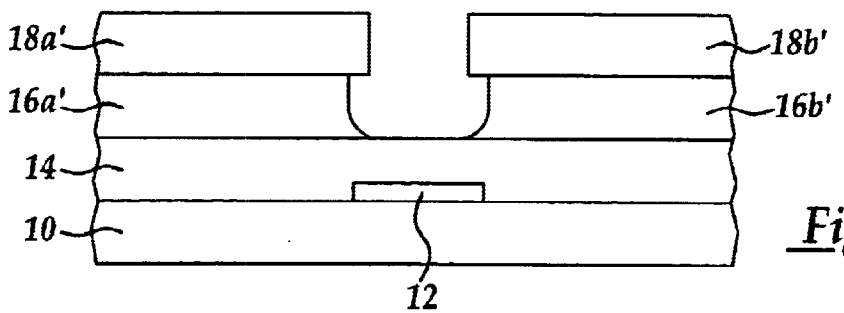

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein the pair of patterned polyamic acid layers 16a and 16b has been thermally annealed to form therefrom a pair of patterned polyimide layers 16a' and 16b'.

Within the preferred embodiment of the present invention, the pair of patterned polyamic acid layers 16a and 16b may be thermally annealed to form therefrom the pair of patterned polyimide layers 16a' and 16b' while employing thermal annealing methods as are conventional in the art of microelectronic fabrication, such thermal annealing methods typically and preferably employing a thermal annealing temperature of from about 100 to about 200 degrees centigrade for a thermal annealing time period of from about 1 to about 30 minutes.

Figure 5:
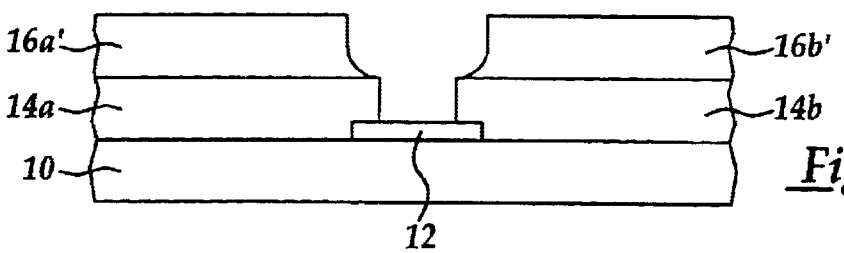

Referring now to FIG. 5, there is shown a schematic cross-sectional diagram illustrating the results of further processing of the microelectronic fabrication whose schematic cross-sectional diagram is illustrated in FIG. 4.

Shown in FIG. 5 is a schematic cross-sectional diagram of a microelectronic fabrication otherwise equivalent to the microelectronic fabrication whose schematic cross-sectional diagram is illustrated in FIG. 4, but wherein: (1) the blanket passivation layer 14 has been patterned to form a pair of patterned passivation layers 14a and 14b; and (2) the pair of hardened patterned photoresist layers 18a' and 18b' has been stripped from over the microelectronic fabrication.

Within the preferred embodiment of the present invention, the blanket passivation layer 14 as illustrated within the schematic cross-sectional diagram of FIG. 4 may be patterned to form the patterned passivation layers 14a and 14b as illustrated within the schematic cross-sectional diagram of FIG. 5 while employing patterning methods as are conventional in the art of microelectronic fabrication, such patterning methods including but not limited to wet chemical etch methods and (as more specifically illustrated within the schematic cross-sectional diagram of FIG. 5) dry plasma etch methods. Similarly, the pair of hardened patterned photoresist layers 18a' and 18b' may be stripped from the microelectronic fabrication whose schematic cross-sectional diagram is illustrated in FIG. 4 to provide in part the microelectronic fabrication whose schematic cross-sectional diagram is illustrated in FIG. 5 while employing photoresist stripping methods as are also conventional in the art of microelectronic fabrication, including but not limited to wet chemical photoresist stripping methods and dry plasma photoresist stripping methods.

Upon forming the microelectronic fabrication whose schematic cross-sectional diagram is illustrated within FIG. 5, there is fabricated a microelectronic fabrication in accord with the preferred embodiment of the present invention. The microelectronic fabrication so fabricated has formed therein a pair of patterned polyimide layers formed with enhanced dimensional control insofar as the pair of patterned polyimide layers is formed from a pair of patterned polyamic acid layers in turn formed from a blanket polyamic acid layer, further wherein when forming the pair of patterned polyamic acid layers from the blanket polyamic acid layer there is employed at pair of hardened patterned photoresist layers, rather than a pair of unhardened patterned photoresist layers.

As is understood by a person skilled in the art, the preferred embodiment of the present invention is illustrative of the present invention rather than limiting of the present invention. Revisions and modifications may be made to methods, materials, structures and dimensions through which is provided a microelectronic fabrication in accord with the preferred embodiment of the present invention while still providing a microelectronic fabrication in accord with the present invention, further in accord with the accompanying claims.

What is claimed is:

1. A method for forming a patterned polyamic acid layer comprising:

provide a substrate;

forming over the substrate a blanket polyamic acid layer;

forming upon the blanket polyamic acid layer a patterned photoresist layer;

hardening the patterned photoresist layer to form a hardened patterned photoresist layer; and patterning, while employing the hardened patterned photoresist layer as an etch mask layer, the blanket polyamic acid layer to form a patterned polyamic acid layer.

2. The method of claim 1 further comprising thermally annealing the patterned polyamic acid layer to form a patterned polyimide layer.

3. The method of claim 2 wherein by employing when forming from the blanket polyamic acid layer the patterned polyamic acid layer the hardened patterned photoresist layer, rather than an unhardened patterned photoresist layer, the patterned polyamic acid layer and the patterned polyimide layer are formed with enhanced dimensional control.

4. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

5. The method of claim 1 wherein the blanket polyamic acid layer is formed of a polyamic acid material having a molecular weight of from about 100,000 to about 10,000,000 amu.

6. The method of claim 1 wherein the blanket polyamic acid layer is formed to a thickness of from about 0.01 to about 50 microns.

7. The method of claim 1 wherein the patterned photoresist layer is formed from a blanket photoresist layer formed of a positive photoresist material which is photoexposed employing photoexposure radiation in a range of from about 340 to about 400 nanometers.

8. The method of claim 1 wherein the patterned photoresist layer is formed to a thickness of from about 0.1 to about 100 microns.

9. The method of claim 1 wherein the patterned photoresist layer is hardened employing a method selected from the group consisting of thermal annealing hardening methods and radiation exposure hardening methods.

10. The method of claim 1 wherein the patterned photoresist layer is hardened to form the hardened patterned photoresist layer while employing a thermal annealing hardening method employing thermal exposure conditions such that a polyamic acid material within the blanket polyamic acid layer is not converted to a polyimide material.

11. The method of claim 1 wherein the patterned photoresist layer is hardened to form the hardened patterned photoresist layer while employing a radiation exposure hardening method employing a radiation source selected from the group consisting of ultraviolet, electron beam, x-ray, microwave and gamma ray radiation sources.

12. The method of claim 1 wherein the blanket polyamic acid layer is patterned to form the patterned polyamic acid layer while employing an aqueous alkaline wet chemical etchant.

13. The method of claim 1 wherein the aqueous alkaline wet chemical etchant is selected from the group consisting of hydroxide aqueous alkaline wet chemical etchants and amine aqueous alkaline wet chemical etchants.

14. The method of claim 1 wherein the patterned polyamic acid layer is thermally annealed to form the patterned polyimide layer while employing a thermal annealing temperature of from about 100 to about 200 degrees centigrade for a thermal annealing time period of from about 1 to about 30 minutes.

* * * * *